(12) United States Patent
Akaogi et al.

(10) Patent No.: US 6,243,316 B1
(45) Date of Patent: Jun. 5, 2001

(54) VOLTAGE BOOST RESET CIRCUIT FOR A FLASH MEMORY

(75) Inventors: Takao Akaogi, Cupertino; Ali K. Al-Shamma, San Jose; Lee Edward Cleveland; Yong Kim, both of Santa Clara; Jin-Lien Lin, Cupertino; Boon Tang Teh, Santa Clara; Kendra Nguyen, San Jose, all of CA (US)

(73) Assignees: Advanced Micro Devices, Inc., Sunnyvale, CA (US); Fujitsu Limited (JP)

( * ) Notice: Subject to any disclaimer, the term of this patent is extended or adjusted under 35 U.S.C. 154(b) by 0 days.

(21) Appl. No.: 09/501,159

(22) Filed: Feb. 9, 2000

(51) Int. Cl.[7] ..................................... G11C 7/00
(52) U.S. Cl. ............... 365/226; 365/230.06; 365/189.11
(58) Field of Search ............... 365/226, 230.06, 365/185.23, 189.11; 327/536, 537, 589; 307/110

(56) References Cited

U.S. PATENT DOCUMENTS

| | | | |
|---|---|---|---|
| 4,096,584 | * 6/1978 | Owen, III et al. | 365/227 |
| 5,282,171 | * 1/1994 | Tokami et al. | 365/230.01 |
| 5,642,313 | * 6/1997 | Ferris | 365/185.25 |
| 5,696,731 | * 12/1997 | Miyamoto | 365/233.5 |
| 6,002,630 | * 12/1999 | Chuang et al. | 365/226 |
| 6,078,531 | * 6/2000 | Miyazima et al. | 365/189.11 |
| 6,134,146 | * 10/2000 | Bill et al. | 365/185.23 |

* cited by examiner

Primary Examiner—Vu A. Le
Assistant Examiner—Van Thu Nguyen
(74) Attorney, Agent, or Firm—Brinks Hofer Gilson & Lione

(57) ABSTRACT

A voltage boost circuit (111) for a memory (100) includes a boosting circuit (110) which is coupled to a boosted node (120) to boost a word line voltage for accessing a core cell of the memory. The voltage boost circuit further includes a reset circuit (112) coupled to the boosted node and including a switchable zero-threshold transistor (202) for resetting the boosted node to a reset voltage (VCC).

11 Claims, 2 Drawing Sheets

VOLTAGE BOOST RESET CIRCUIT FOR A FLASH MEMORY

BACKGROUND OF THE INVENTION

The present invention relates generally to semiconductor memory devices. More particularly, the present invention relates to an improved boost reset circuit for a flash memory.

In the design of integrated circuits, there is a trend to power the integrated circuits using decreasing supply voltage levels. Previous circuit families operated at 5 volts and 3.3 volts. Current families operate at 1.8 volts and future families will operate at 1.0 volts nominal supply voltage. These lower supply voltages create design and operation problems.

One design problem relates to accessing a core cell of the memory device. The voltage swing available in a 1.0 volt supply system is typically insufficient for a read or a program of a flash memory cell. Accordingly, boost circuits have been developed to provide the necessary voltage variation. For accessing the core cell, a word line voltage is boosted to, for example, 4.0 volts. This allows the core cell transistor to fully turn on and the core cell to sink enough current for rapid sensing of the state of the cell.

To control operation of the boost circuit, particularly when many address inputs are changing, a reset circuit is incorporated in the boost circuit. The reset circuit responds to address transitions by resetting the boosted voltage to a reset value. However, the reduction in supply voltage for the memory to 1.0 volts. interferes with the operation of the reset circuit. A p-channel transistor used for resetting the boosted voltage cannot be adequately turned on at low supply voltage to ensure rapid reset.

Accordingly, an improved reset circuit for a boost circuit for a memory device is required for operation at reduced supply voltages.

SUMMARY

By way of introduction only, an improved voltage boost reset circuit includes a zero-threshold transistor coupled to the boosted node. The voltage of the boosted node is boosted to a predetermined voltage by the boost circuit for increasing memory word line voltages. To improve the performance and response time of the boosted node, the reset circuit applies a voltage to turn on the zero-threshold transistor very strongly. Accordingly, the boosted node is rapidly reset for subsequent boosting. When boosting is occurring, the zero-threshold transistor is turned off to isolate a reset voltage from the boosted voltage.

The foregoing discussion of the preferred embodiments has been provided only by way of introduction. Nothing in this section should be taken as a limitation on the following claims, which define the scope of the invention.

BRIEF DESCRIPTION OF THE DRAWINGS

FIG. 3 is a timing diagram illustrating operation of the reset circuit of FIG. 2.

DETAILED DESCRIPTION OF THE PRESENTLY PREFERRED EMBODIMENTS

Figure 1:
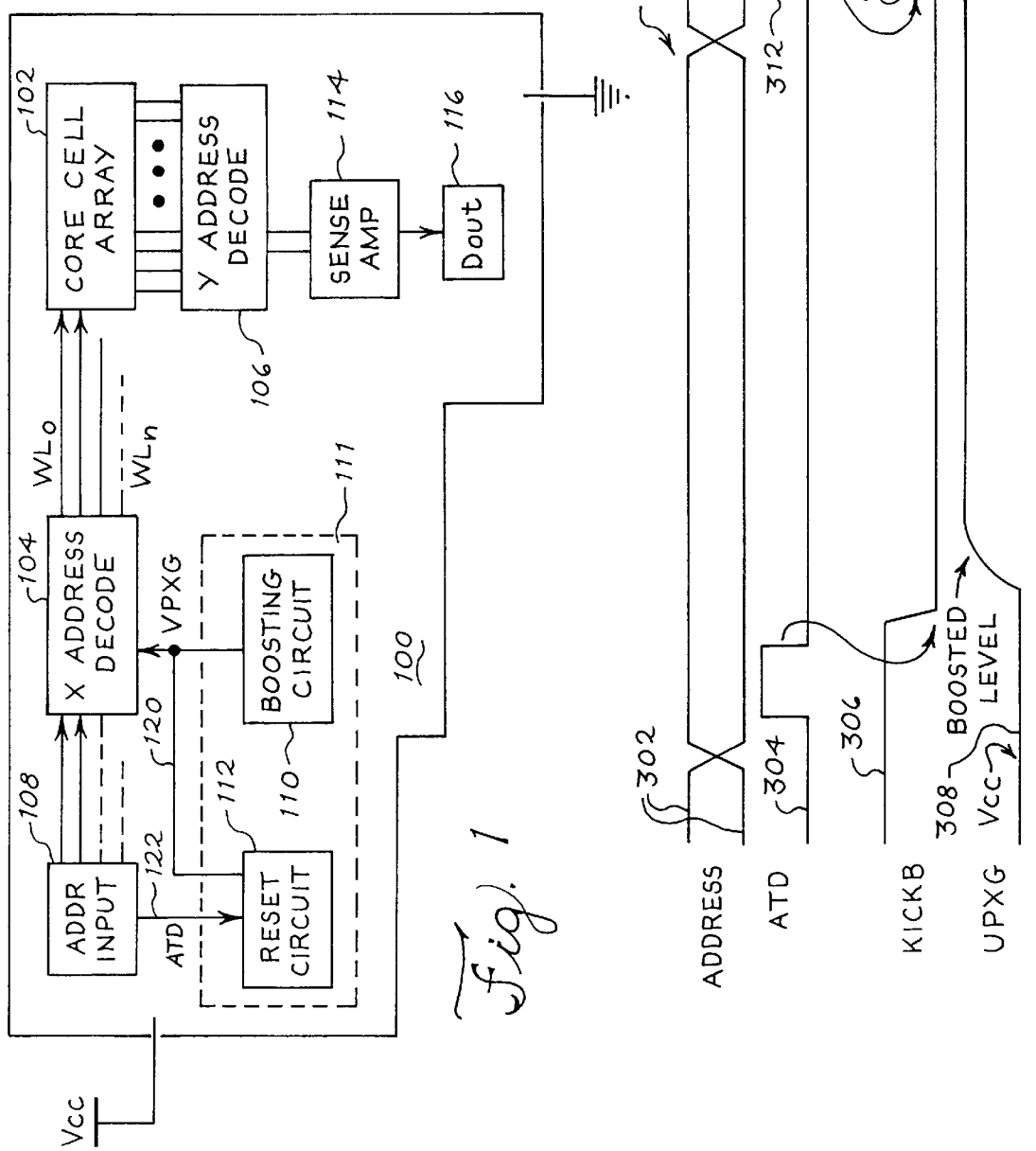
FIG. 1 is a block diagram of a memory.

Referring now to FIG. 1, it shows a block diagram of a memory 100. In the illustrated embodiment, the memory 100 is configured as a flash memory formed as a complementary metal-oxide-semiconductor (CMOS) integrated circuit for storing digital data. However, the memory 100 may take any other suitable form and in fact the principles described herein may be applied in any other suitable circuit in which a particular node is boosted to a relatively high voltage for varying or improving operation of the circuit. The memory 100 includes a core cell array 102, an x-address decoder 104, a y-address decoder 106, address inputs 108, a boost circuit 111, a reset circuit 112, a sense amplifier 114 and data out circuit 116.

The core cell array 102 includes a plurality of core cells, each configured to store data. In some applications, each core cell may store a single bit of data; in other applications, each core cell may store two or more bits of data. Each core cell of the core cell array 102 is accessed by providing its address at the address inputs 108. Each core cell has a unique address which is decoded by the x-address decoder 104 and y-address decoder 106.

In general, the x-address decoder 104 responds to the address input signal provided at the address inputs 108 to activate one word line of a plurality of word lines labeled WL0 through WLn in FIG. 1. Each word line is associated with one row of the core cell array 102. In response to activation of the word line, core cells associated with that word line turn on and begin sinking current. To adequately turn on the core cells, the word line must be varied by a substantial potential difference, such as 4 V.

The y-address decoder 106 couples the appropriate column of the core cell array 102 to the sense amplifier 114. The y-address decoder 106 responds to an address at the address inputs 108 to decode the selected column from among a plurality of columns of the core cell array 102. The sense amplifier 114 senses the current in the selected core cell array and determines the binary state of the data stored in the core cell. The data out circuit 116 provides the core cell data for use external to the memory 100. Other circuitry, not shown in FIG. 1, provides for programming and verifying individual core cells of the core cell array 102.

The memory 100 operates in response to a supply voltage, labeled VCC in FIG. 1. The potential difference between VCC and ground is the supply voltage and may be in the range 0.9 to 3.3 volts. The suitability of the supply voltage VCC will depend on a variety of factors, including the technology with which the memory 100 is fabricated. In general, in advanced CMOS processes, the supply voltage will nominally be 0.9 volts. This is less than or comparable to the turn-on or threshold voltage Vtp for p-channel transistors of −0.9 volts and the threshold voltage Vtn for n-channel transistors of +1.0 volts.

In the embodiment of FIG. 1, the memory 100 may be operated at low supply voltages such as 0.9 volts. At such low supply voltage levels, some circuitry will not work well or at all. In particular, the core cell array 102 requires a substantial variation on the word line voltage in order to properly access each core cell.

In order to adequately vary the word line voltage, the memory 100 includes a boost circuit 111 including a boosting circuit 110 and a reset circuit 112. The boosting circuit 110 produces a boosted voltage on a boosted node 120 coupled to the x-address decoder 104. In FIG. 1, the boosted node 120 is labeled VPXG. The x-address decoder 104 responds to the boosted voltage by boosting word line voltage of an activated word line upon activation to a boosted voltage suitable for accessing a core cell of the core cell array 102. For example, the boost circuit 110 might increase the voltage on the boosted node 120 by substantially 4.0 volts.

To further control the performance of the boosting circuit 110, the memory 100 includes the reset circuit 112. The reset circuit 112 is coupled to the boosted node 120 and includes a zero-threshold transistor coupled between the boosted node and a reset node for resetting the boosted node from the boosted voltage to a reset voltage, as will be discussed in further detail in connection with FIG. 2. In order to improve performance of the boosting circuit 110, the reset circuit 112 returns the voltage on the boosted node 120 to a consistent initial value or reset value. If the boosted node 120 is not reset to a reset value, the timing of core cell access may be adversely affected. In particular, the access time for reading or programming a core cell may be increased.

The reset circuit 112 receives an address transition detect (ATD) signal on node 122 from the address inputs 108. In response to a variation of any of the address inputs provided to the memory 100, the address transition detection signal goes to an active level. The reset circuit 112 responds to the ATD signal to control the reset of the boosted node VPXG.

Figure 2:
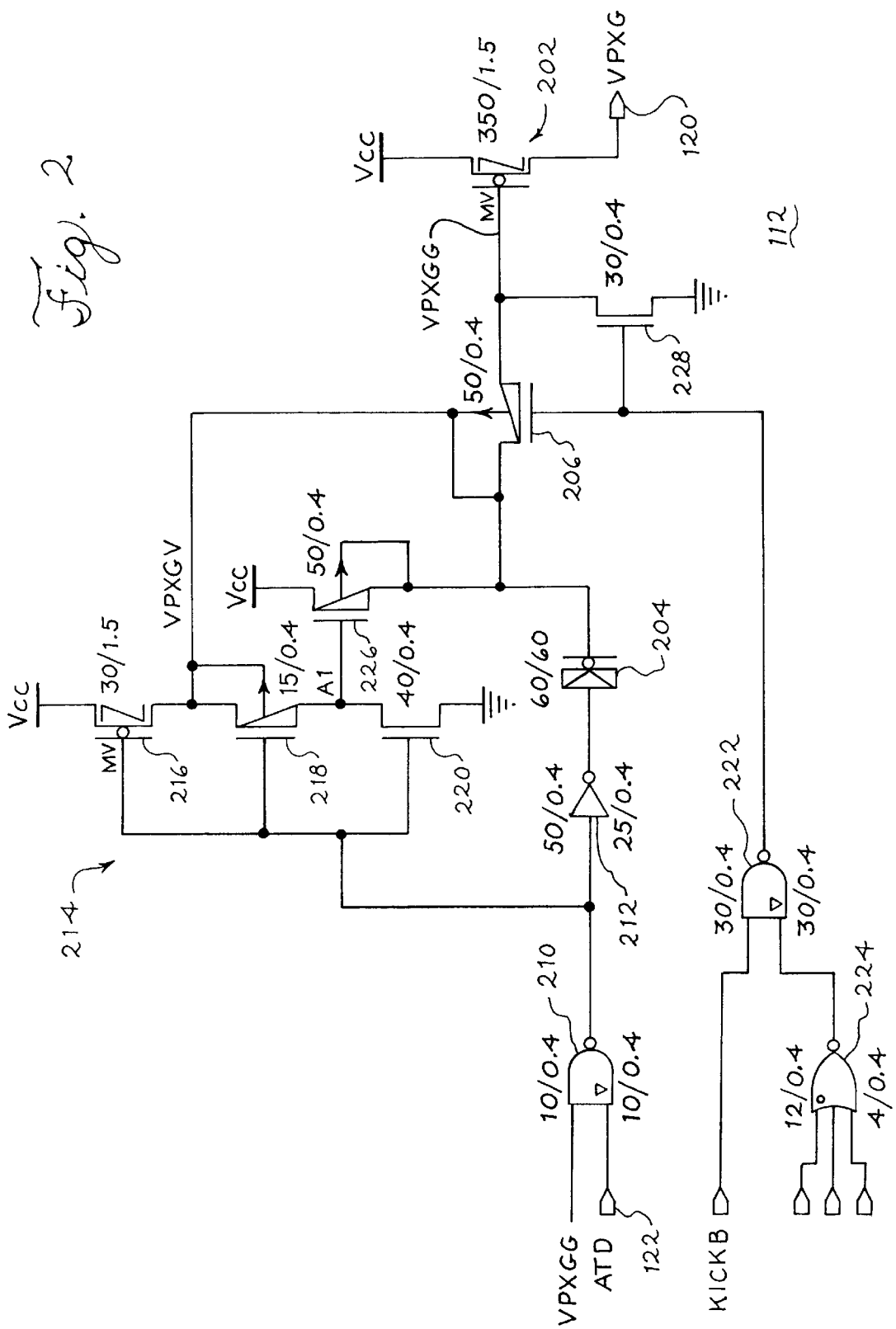
FIG. 2 is a block diagram of a reset circuit for use in the memory of FIG. 1.

FIG. 2 is a circuit diagram illustrating the reset circuit 112 of FIG. 1. The reset circuit 112 includes a zero-threshold transistor 202, a capacitor 204, a switch in the form of a transistor 206, a NAND gate 210, an inverter 212, a gate 214 including a transistor 216, transistor 218 and transistor 220, a second NAND gate 222, a NOR gate 224, a transistor 226 and a transistor 228. Device sizing is indicated in the schematic diagram of FIG. 2. These sizes are exemplary only. Other device sizes and circuit configurations may be used where suitable.

The zero-threshold transistor 202 has a gate coupled to a node labeled VPXGG in FIG. 2, a drain coupled to the supply voltage VCC, also referred to herein as the reset voltage, and a source coupled to the boosted node 120, labeled VPXG. The zero-threshold transistor 202 is indicated in the schematic diagram of FIG. 2 with a Z symbol. The zero-threshold transistor has a threshold voltage of substantially zero volts. That is, the zero-threshold transistor 202 is turned on and conducting drain current between its drain and source when a gate to source voltage of substantially zero volts is applied to the zero-threshold transistor 202. To turn off the transistor, a voltage of less than zero volts must be applied between the gate and the source. The threshold voltage of the zero-threshold transistor 202 may vary from zero volts due to normal process and device variation. The zero-threshold transistor 202 is manufactured using conventional semiconductor manufacturing techniques. For example, the zero-threshold transistor 202 may be manufactured using a conventional semiconductor processing flow which omits any channel implant in an N-channel transistor.

The gate of the zero-threshold transistor 202 is controlled by transistor 206. Transistor 206 operates as a switch coupled between the capacitor 204 and a zero-threshold transistor 202. The switch closes to apply a turn-on voltage from the capacitor 204 to the gate of the zero-threshold transistor 202 for turning on the zero-threshold transistor. The transistor 206 is a p-channel transistor with a source coupled to the capacitor 204, a gate coupled to the output of the NAND gate 222 and a drain coupled to the gate of the zero-threshold transistor 202. The transistor 206 is a low threshold transistor, as indicated by the diagonal line drawn through its symbol in FIG. 2. The transistor 206 has a threshold voltage of approximately −0.5 volts. This is considerably smaller than the threshold voltage of conventional p-channel transistors, which are typically approximately −1.2 volts.

The capacitor 204 is a conventional capacitor formed using CMOS technology. A gate is formed over field oxide to define the capacitance of the capacitor 204. Other types of capacitors or charge-boosting devices may be used as appropriate.

The NAND gate 210 has two inputs. A first input is coupled to the gate of the zero-threshold transistor 202, a node labeled VPXGG in FIG. 2. The second input of the NAND gate 210 is coupled to the ATD node 122. The output of the NAND gate 210 is provided to an input of the inverter 212. The inverter 212 inverts the signal from the NAND gate 210 and applies the inverted signal to the capacitor 204. The NAND gate 222 has a first input coupled to a node labeled KICKB and a second node coupled to an output of the NOR gate 224. All of the inputs of the NOR gate 224 remain low during operation of the reset circuit 112, so that the output of the NOR gate 224 remains high. The signal KICKB is generated in response to transitions of the ATD node 122, and will be shown in further detail in conjunction with FIG. 3. The output of the NAND gate 122 controls the gate of the transistor 206 and transistor 228.

The gate 214 responds to variations of the output of the NAND gate 210. The transistor 216 is an n-channel, zero-threshold transistor having a drain coupled to supply voltage VCC, a gate coupled to the output of the NAND gate 210 and a source coupled to node VPXGV. The transistor 218 is a low threshold p-channel transistor having a source coupled to the node VPXGV, a gate coupled to the output of the transistor 210 and a drain coupled to node A1. The transistor 220 is an n-channel transistor having a drain coupled to node A1, a gate coupled to the output of the NAND gate 210 and a source coupled to ground potential. The transistor 226 is a low-threshold p-channel transistor having a source coupled to the supply voltage node VCC, a gate coupled to node A1 and a source and substrate coupled to the capacitor 204.

FIG. 3 is a timing diagram illustrating operation of the reset circuit 112 of FIG. 2. In FIG. 3, variation of the address inputs to the memory 100 (FIG. 1) which incorporates the reset circuit 112 are shown as address signals 302. The address signals 302 are provided from outside the memory 100 and are thus completely random signals.

In response to variation of one or more address signals 302, the address transition detect (ATD) signal 304 pulses logic high for a predetermined duration.

The falling edge of the ATD signal 304 generates a falling edge on the KICKB signal 306. The circuitry necessary for generating the KIKB signal 306 in response to the ATD signal 304 is not shown in FIG. 2. However, such circuitry may be readily devised by those ordinarily skilled in the art.

In response to the falling edge of the KICKB signal 306, the output of the NAND gate 222 changes from a low state to a high state. This variation turns off the transistor 206, decoupling the capacitor 204 from the gate of the zero-threshold transistor 202. The variation in the output of the NAND gate 222 also turns on transistor 228. Transistor 228 discharges node VPXGG, pulling the gate of the zero-threshold transistor 202 to ground and turning off the zero-threshold transistor 202. By turning off the zero-threshold transistor 202, the boosted node 120 is isolated from the supply voltage node VCC. In this manner, the boosted voltage 308 on the boosted node 120 can be charged to a boosted level, as indicated in FIG. 3, by the boost circuit 110 (FIG. 1) without affecting the supply voltage VCC.

Subsequently, node VPXGG is reset to a logic high level. This node is connected to an input of the NAND GATE 210. The voltage boost should start after VPXGG reaches high level (Vcc) so that the gate voltage of transistor 202 can be boosted effectively.

As shown in FIG. 3, another address transition 310 of the address signals 302 occurs subsequently. In response to the address transition, the ATD signal 304 pulses high for a predetermined time duration. In response to the rising edge 312 of the ATD signal 304, the KICKB signal 306 transitions from low to high at rising edge 314. On the rising edge of the ATD signal 304, the output of the NAND gate 210 goes low. In response, the output of the inverter 212 goes high. This transition is coupled through the capacitor 204 and boosted to a larger voltage, such as four volts.

During the same time, in response to the rising edge 314 of the KICKB signal 306, the output of the NAND gate 222 goes low, turning off the transistor 228. This also turns on the transistor 206, coupling the boosted voltage from the capacitor through the transistor 206 to node VPXGG, the gate of the zero-threshold transistor 202. Because of the capacitive boost, the voltage on VPXGG goes higher than the supply voltage VCC. As a result, the zero-threshold transistor 202 turns on strongly, coupling the boosted node 120 labeled VPXG to VCC and resetting the boosted node 120 from its boosted voltage to a reset voltage, the supply voltage VCC.

With the zero-threshold transistor 202 turned on strongly, the boosted node 120 can be reset very quickly. This is an improvement over previous circuits which used a p-channel transistor for resetting the boosted node. At low supply voltages, the p-channel transistor does not turn on strongly, since its threshold voltage is −0.9 volt. If VCC is 0.9 or 1.0 volts, the p-channel transistor may turn on only very weakly. Rapid reset of the boosted node is important for reducing the access time of the memory 100 and for making access times at all rows of the core cell array 102 consistent.

After the predetermined duration of the ATD signal 304, this signal goes low at falling edge 316. As a result of the falling edge 316, the KICKB signal 306 transitions from the high level to a low level at the falling edge 318. In the reset circuit of FIG. 2, the falling edge 316 of the ATD signal 304 is inverted to a rising edge at the output of the NAND gate 210. The signal is again inverted by the inverter 212 to a falling edge at the capacitor 204. In response to the falling edge 318 of the KICKB signal 306, the NAND gate 222 produces a rising edge at its output. This rising edge turns on the reset transistor 228 and turns off the transistor 206, discharging the node VPXGG and turning off the zero-threshold transistor 202. This isolates the boosted node 120 from the supply node VCC so that the boost circuit 110 can subsequently boost the boosted node VPXG to its boosted level, greater than VCC, without affecting the voltage on node VCC.

The gate 214, in conjunction with transistor 226, operates as a preset circuit. Preferably, the gate of the capacitor 204 is initially charged to a voltage of VCC. However, during transitions, this node can rise substantially above VCC and therefore must be isolated from the supply voltage VCC. The preset circuit performs this function.

Initially, before an address transition occurs, the ATD signal is low so that the output of the NAND gate 210 is high. The gate 214 acts as an inverter so that the output at node A1 is low. This turns on the p-channel transistor 226 so that the gate of the capacitor 204 is charged up to VCC. This node is VPXGV, coupled to the source of the zero-threshold transistor 216, which is turned off. When the ATD signal 304 goes high, the output of the NAND gate 210 goes low. Node A1 goes high, turning off the transistor 226. After a delay associated with the inverter 212, the output of this inverter goes high and the capacitor 204 boosts the voltage on the node of VPXGV, at the source of the transistor 206.

Because of the capacitive boost, the voltage on VPXGB goes higher than the supply voltage VCC. Since the transistor 218 is turned on, node Al is coupled to node VPXGV and the voltage on node A1 follows the voltage on node VPXGV. Since the gate to source voltage of the p-channel transistor 226 is equal to the voltage on node A1 minus VCC, this voltage remains greater than zero and as result the transistor 226 never turns on. As a result, during the capacitive boost, transistor 226 operates to isolate the supply voltage VCC from the boosted voltage on the node VPXGV. Thus, no charge is lost from node VPXGV to the supply voltage node VCC; all of the charge on the capacitor 204 is coupled through the transistor 206 to the gate node, node VPXGG.

From the foregoing, it can be seen that the present invention provides an improved voltage boost reset circuit for a flash memory. A zero-threshold n-channel transistor is provided for coupling the boosted node to a reset node which is charged to a reset voltage. Since the output transistor has a zero-volt threshold voltage, it can be turned on very strongly in order to reset the voltage on the highly capacitive boost node very quickly. Separately, reset circuitry isolates the boosted voltages from supply voltages of the memory chip.

While a particular embodiment of the present invention has been shown and described, modifications may be made. For example, the sense of the individual transistors, p-channel and n-channel, may be reversed in suitable applications. Further, the inventive concepts described herein may be applied to circuits other than memory devices. It is therefore intended in the appended claims to cover all such changes and modifications which fall within the true spirit and scope of the invention.

What is claimed is:

1. A voltage boost circuit for a memory, the voltage boost circuit comprising:
    a boosting circuit coupled to a boosted node to boost a word line voltage for accessing a core cell of the memory;
    a reset circuit coupled to the boosted node and including a switchable zero-threshold transistor for resetting the boosted node to a reset voltage;
    a capacitor; and
    a switching device to selectively couple the capacitor to the zero-threshold transistor for coupling the boosted node to the reset voltage.

2. The voltage boost circuit of claim 1 wherein the zero-threshold transistor is coupled between the boosted node and a power supply node for resetting the boosted node to the reset voltage at the power supply node.

3. The voltage boost circuit of claim 2 wherein, in response to a transition on an address input of the memory, the switching device couples the capacitor to the zero-threshold transistor to raise a gate voltage of the zero-threshold transistor above the reset voltage to turn on the zero-threshold transistor.

4. The voltage boost circuit of claim 3 wherein the reset circuit is configured to turn off the zero-threshold transistor following a reset time period to isolate the power supply node from the boosted node.

5. The voltage boost circuit of claim 1 wherein the reset circuit is responsive to address changes of the memory device for controlling the switchable zero-threshold transistor.

6. A method for controlling a voltage boosted node in a memory, the method comprising the steps of:

(a) boosting voltage on the voltage boosted node;

(b) in response to a transition of one or more address inputs of the memory, generating a reset signal;

(c) applying the reset signal to a zero-threshold transistor to couple the voltage boosted node to a reset voltage to reset the voltage boosted node to the reset voltage, including (c1) storing charge on a capacitor; and (c2) coupling the capacitor to the zero-threshold transistor to turn on the zero-threshold transistor for coupling the voltage boosted node to a supply voltage node of the memory.

7. The method of claim 6 further comprising the steps of:

presetting a voltage of the capacitor to a supply voltage of the memory on the supply voltage node before resetting the voltage boosted node; and when boosting the voltage on the voltage boosted node, isolating the supply voltage node from the voltage boosted node.

8. The method of claim 6 further comprising the steps of:

(d) removing the reset signal following a reset time period; and (e) subsequently, boosting the voltage on the voltage boosted node from the reset voltage to a boosted voltage.

9. A memory comprising:

a core cell array;

an address decoder for activating one word line of a plurality of word lines, each word line associated with one row of the core cell array;

a boosting circuit for producing a boosted voltage on a boosted node coupled to the address decoder, the address decoder responding to the boosted voltage by boosting word line voltage of the one word line upon activation to a boosted voltage suitable for accessing a core cell of the core cell array;

a reset circuit coupled to the boosted node, the reset circuit including a zero-threshold transistor coupled between the boosted node and a reset node for resetting the boosted node from the boosted voltage to a reset voltage;

a capacitor; and a switch coupled between the capacitor and the zero-threshold transistor, the switch closing to apply a turn-on voltage from the capacitor to a gate of the zero-threshold transistor for turning on the zero-threshold transistor.

10. The memory of claim 9 wherein the reset circuit further comprises:

a turn-off device for turning off the zero-threshold transistor, isolating the boosted node from the reset voltage.

11. The memory of claim 9 wherein the reset voltage comprises a power supply voltage of the memory.

* * * * *